(12) United States Patent
Sköld et al.

(10) Patent No.: US 6,430,035 B2
(45) Date of Patent: *Aug. 6, 2002

(54) SYSTEM FOR ASSEMBLY AND MAINTENANCE OF CONNECTION MODULES IN HIGH-VOLTAGE SWITCHGEAR, A METHOD THEREFOR AND A SYSTEM COMPONENT

(75) Inventors: Leif Sköld, Ludvika; Torbjörn Linder, Saxdalen, both of (SE)

(73) Assignee: ABB AB, Vasteras (SE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 77 days.

(21) Appl. No.: 09/284,478
(22) PCT Filed: Oct. 20, 1997
(86) PCT No.: PCT/SE97/01755
§ 371 (c)(1),
(2), (4) Date: May 21, 1999
(87) PCT Pub. No.: WO98/19376
PCT Pub. Date: May 7, 1998

(30) Foreign Application Priority Data
Oct. 21, 1996 (SE) .................................. 9603861

(51) Int. Cl.$^7$ ................................................. H02B 5/00
(52) U.S. Cl. ................... 361/605; 361/600; 361/601; 361/602; 307/147
(58) Field of Search ................... 361/601–603, 361/620, 621, 622, 623; 307/112, 9.1, 113; 200/48 R; 174/50, 50.52, 5 R, 6

(56) References Cited

U.S. PATENT DOCUMENTS

| 3,697,819 A | * 10/1972 | Eichelberger et al. .... 200/48 R |
| 4,367,512 A | 1/1983 | Fujita |
| 4,562,360 A | * 12/1985 | Fujimoto ..................... 307/149 |
| 5,210,679 A | * 5/1993 | Takamoto et al. .......... 361/618 |
| 5,648,888 A | * 7/1997 | Le Francois et al. ....... 361/603 |

FOREIGN PATENT DOCUMENTS

| DE | 622 594 | 7/1938 | |
| DE | 2 024 662 | 3/1971 | |
| DE | 20 16 434 | 10/1971 | |
| DE | 28 48 648 | 6/1979 | |
| DE | 004 139 177 | * 6/1992 | ............. 361/602 A |
| JP | 01 012 806 | * 1/1989 | ............. 361/618 R |
| WO | WO 98/36480 | * 8/1998 | ............. H02B/7/00 |

* cited by examiner

Primary Examiner—Boris Chervinsky
(74) Attorney, Agent, or Firm—Oblon, Spivak, McClelland, Maier & Neustadt, P.C.

(57) ABSTRACT

The invention relates to a system and a method for assembly and maintenance of connection modules (3) in high-voltage switchgear (1). According to the invention assembly and maintenance are performed in a service bay (6) in the vicinity of the switchgear. Modules (3a) to be assembled, replaced or repaired are transported between the service bay (6) and its site (2a) in the switchgear area by a service vehicle (4). The vehicle (4), connection modules (3) and the positions for their base plates (2) are thus so adapted to each other that the service vehicle (4) can move about in the switchgear area while the switchgear is in operation. A special aspect of the invention is the custom-design of the service vehicle (4) specifically for its purpose.

4 Claims, 4 Drawing Sheets

SYSTEM FOR ASSEMBLY AND MAINTENANCE OF CONNECTION MODULES IN HIGH-VOLTAGE SWITCHGEAR, A METHOD THEREFOR AND A SYSTEM COMPONENT

BACKGROUND OF THE INVENTION

1. Field of the Invention

The present invention relates in a first aspect to a system for assembly and maintenance of connection modules in high-voltage switchgear. From a second aspect the invention relates to a method for assembly and maintenance of such connection modules. From a third aspect the invention relates to a central component in such a system, namely a service vehicle.

2. Discussion of the Background

Such switchgear generally includes a large quantity of electrical apparatus, in the following termed connection modules, which are arranged in a number of lines, normally three, which lines are oriented in the same direction as the overhead power transmission lines entering and leaving the switchgear. Each connection module is normally supported individually on a stand, i.e. each breaker, each disconnector, each grounding device, each surge diverter and each current meter has its own stand. The large number of components required in an air-insulated high-voltage switchgear station, and the demand for safe electrical distance between each unit require that a conventional switchgear occupies a considerable ground area. The extension in the direction of the overhead power lines of a switchgear for a voltage level of 245–500 kV, defining the length of the switchgear station, is approximately 100–150 meter. A 420 kV switchgear station would be typically about 120 m.

Alternatively a plurality of electrical components may be combined in an apparatus part arranged on a common stand. Such connection modules can reduce the area occupied by the switchgear. A switchgear of such a type is described in Swedish patent application No. 96 02336-1 and various examples are described therein of how connection modules can be designed, where a common stand carries several components. The stands are placed at erection sites with base plates to anchor the stands.

When connection modules for a switchgear are to be assembled in a conventional manner the apparatus parts are transported to the respective erection sites, after which the parts are assembled on site by means of a mobile crane, for instance. Only when the apparatus parts are in place and have been assembled can the control cabling be installed and connected, usually directly to terminal blocks in the control devices.

Maintenance work such as inspection of contacts or repairs according to conventional technology is also performed on the erection site using mobile cranes or the like. Parts of the switchgear in the vicinity must be taken out of operation and rendered dead throughout the time needed for the work. Such shut-downs can entail considerable costs and it would therefore be desirable to be able to reduce or eliminate shut-downs caused by such maintenance work.

SUMMARY OF THE INVENTION

In the light of this, the object of the present invention is to provide a system for assembly and maintenance of connection modules in high-voltage switchgear in which the problems of forced shut-downs associated with conventional technology in the area are solved.

The system and method are thus based on all that work in connection with assembly and service being performed at a place other than within the switchgear area, and that the assembled or repaired connection module is transported out to its erection site. This means that such work is eliminated on site and no shut-down in operation need occur.

Transport of the connection modules could in fact be performed using a conventional fork lift truck. However, the transport places rather special demands on the transport vehicle when it is to drive a connection module out to its site, with respect to stability, anchoring of the load and accessibility in the limited space and under the special circumstances prevailing. It is therefore important that one component in the system consists of the special service vehicle defined in the claim. Such a custom-built service vehicle enables connection modules to be transported in an optimal and effective manner.

According to a preferred embodiment of the system according to the invention the service bay is situated indoors, which offers additional advantages since the work can then be performed protected from wind and weather as well as facilitating the installation of fixed aids such as overhead cranes and the like.

In another preferred embodiment the service bay is equipped with such aids and other service equipment, enabling the work to be performed effectively. The service bay according to this embodiment also includes a stock of spare parts and/or complete connection modules in reserve. When a connection module is to be repaired or serviced it can merely be transported out of the way and replaced by a similar module ready for use from stock.

According to a further preferred embodiment of the system, a number of grounding points are arranged within the area of the switchgear, and the service vehicle can be connected optionally to any of these grounding points. During transport of a connection module in upright position, therefore, its stand part will be grounded while its apparatus part is separated from ground by the insulators. It can therefore be transported close to live modules, and even touch these, without risk of electric flashover.

According to a preferred embodiment the service vehicle has a frame which is open in one direction so that it can straddle the stand of a connection module, thereby enabling fast and simple loading of the module and stable transport.

In a preferred variant of this embodiment the opening can be closed so that, when the stand of the module has been straddled, the vehicle has a closed frame thereby increasing its stability considerably.

According to another preferred embodiment the service vehicle is provided with support members, vertically movable in relation to the frame, to facilitate lifting the connection module from its base plate when it is to be transported. The support member suitably comprises a pair of beams that are raised and lowered together.

It is advantageous for the service vehicle to be designed with, on the one hand, a broad wheel base but, on the other hand, a narrow waist part. Stability during transport is then achieved, as well as flexibility to move between the modules in the switchgear station. To further increase its ability to turn around between the modules it is advantageous if the wheels can be steered individually.

BRIEF DESCRIPTION OF THE DRAWINGS

The invention will be explained in more detail in the following description of preferred embodiments, with reference to the accompanying drawings in which.

DETAILED DESCRIPTION OF THE PREFERRED EMBODIMENTS

Figure 1:
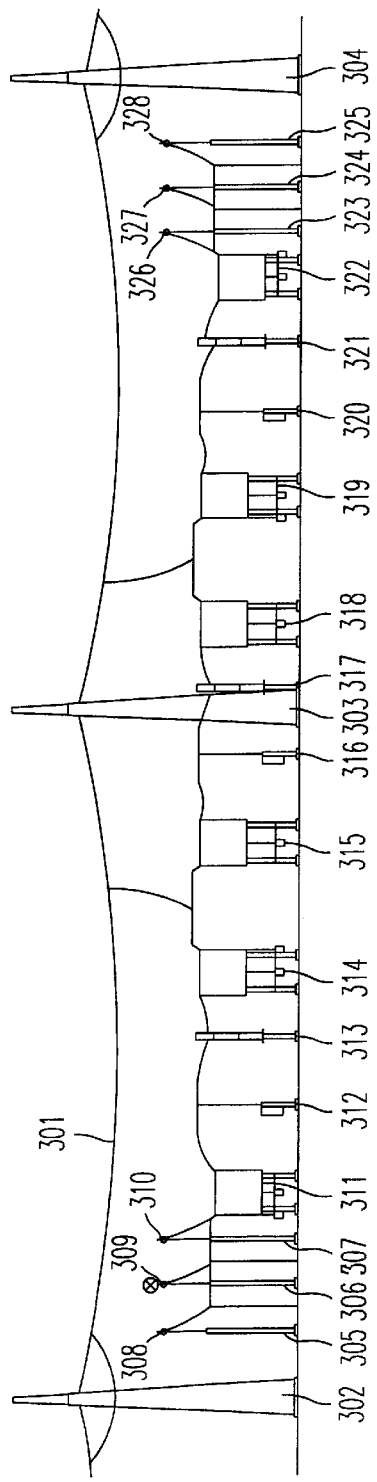
FIGS. 1–3 show side views of various types of switchgear where the invention is applicable.

FIG. 1 illustrates the layout of a conventional switchgear, showing how the components in a row of apparatus are arranged. In a typical switchgear of this type three identical rows of apparatus are placed parallel with each other. The overhead power transmission lines 301 are supported by three pylons 302, 303, 304, one at each end of the row of apparatus and one in the middle. From left to right in the figure, the switchgear comprises the following units: a first group of three pillar stands 305, 306, 307, each carrying a busbar 308, 309, 310, which busbars are directed perpendicular to the plane of the figure, a first disconnector 311, a first breaker 312, a first current transformer 313, a second disconnector 314, a third disconnector 315, a second breaker 316, a second current transformer 317, a fourth disconnector 318, a fifth disconnector 319, a third breaker 320, a third current transformer 321, a sixth disconnector 322 and a second group of three pillar stands 326, 327, 328, each carrying a busbar 323, 324, 325. In this conventional arrangement the row of apparatus for 420 kV is approximately 120 meter in length.

Figure 2:
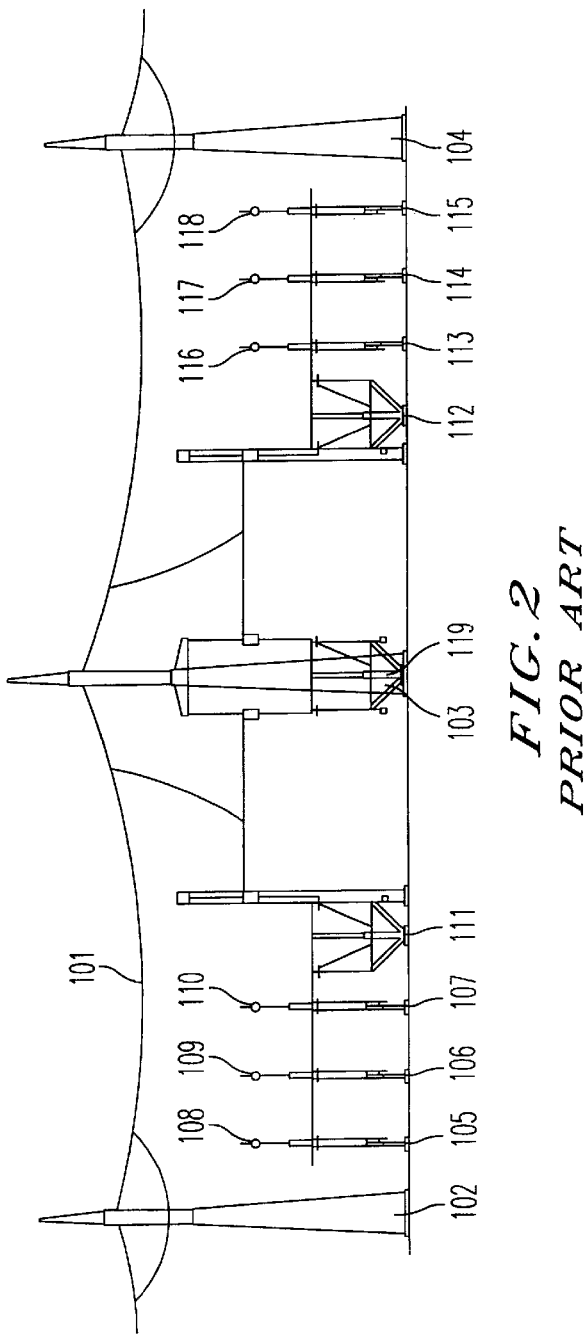

In FIG. 2, showing a more compact arrangement of a switchgear from the same angle as FIG. 1, the overhead power lines 101 are supported in the same way as above, by one pylon 102, 104 respectively, at each end of the row of apparatus and one pylon 103 in the middle. Here, too, stands 105–107 and 113–115 carrying busbars 108–110 and 116–118, respectively are arranged outermost at each end of the row of apparatus. Between these a first stand 111, a second stand 119 and a third stand 112 are arranged, each carrying a plurality of components including breakers and disconnectors. Such a multi-component stand is described in more detail in SE 9600123-5. Between the first multi-component stand 11 and the second multi-component stand 119 and between the second multi-component stand 119 and the third multi-component stand 112 is a space with a height of the dead zone above ground level that is higher than at the other parts of the line.

Figure 3:
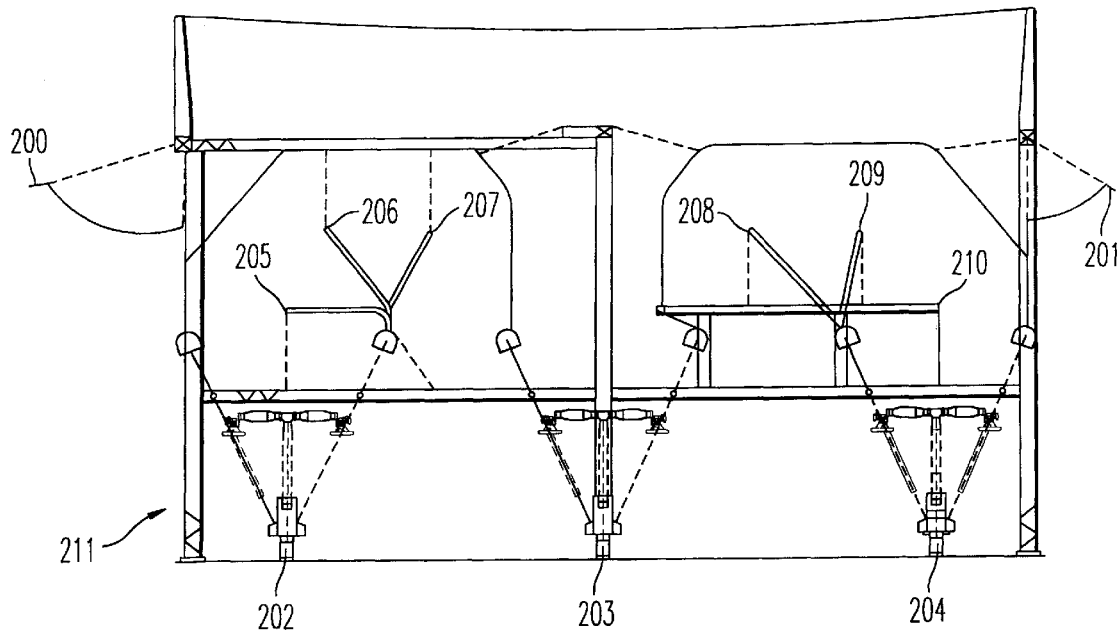

FIG. 3 shows yet another example of a switchgear where the invention is applicable. The row of apparatus here consists of only three units, i.e. three multi-component stands 202, 203, 204 similar to the equivalent stands in the layout according to FIG. 2. The overhead power lines 200, 201 and busbars 205–210 are supported by a stand frame 211 located between the rows of apparatus with components. FIG. 3 illustrates only one line and one such stand frame. The switchgear comprises two such stand frames 211 with a line at the side and outside each stand frame and a line located between them.

Figure 4:
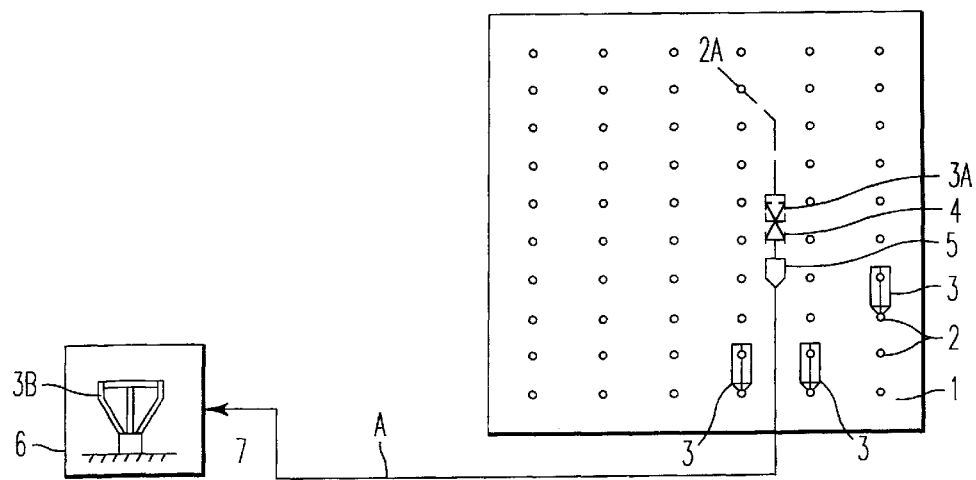
FIG. 4 is a schematic illustration of the principle for the layout of a system according to the invention

To perform assembly of and service on one of the stands with its connection parts, i.e. a connection module, a system is used according to the invention as shown schematically in FIG. 4. The connection modules are arranged within a switchgear area 1 and are arranged in the rows in X and Y direction. Each connection module is secured in the ground at a base plate 2 constituting the erection site of the module. In FIG. 4 only a few of the connection modules 3 in the switchgear are shown schematically, whereas only the erection sites 2 have been marked for the others.

If any of the connection modules in the switchgear needs repair or inspection, e.g. the module with base plate 2 as erection site, a service vehicle 4 is driven in to the switchgear area, up to the relevant connection module, the module then being loaded onto the service vehicle 4 in a manner to be described later. FIG. 4 shows the service vehicle 4 which is constructed as a trailer drawn by a traction vehicle 5, on its way from the base plate 2a with its connection module 3a as load, heading for a service bay 6. The connection module 3a is transported in an erect position.

The base plates 2 for erection of the connection modules are positioned relative to each other so that the service vehicle 4 has room to drive between them, at least along certain corridors, e.g. along the route A marked in the Figure for the service vehicle 4. The connection module 3a being transported and the connection modules 3 already in place are so adjusted to each other as to allow free passage for the connection module 3a being transported. The service vehicle 4 is grounded and, via the trailer, also the stand of the connection module being transported. Since its apparatus part is joined to the stand via insulators, the apparatus part can, without problem, move quite close to adjacent connection modules 3 and even touching some of them can be accepted.

The connection module 3a is transported to a service bay 6 outside the area. The module can be repaired in the service bay 6 and then transported back to its place in the switchgear station. However, it is even more suitable to simply exchange the connection module 3a for an identical module kept in stock as a complete unit at the service bay. The connection module 3a to be repaired is unloaded, after which the spare connection module 3b is loaded onto the trailer for transport out to the erection site 2a.

The service bay 6 may be situated outdoors, but it is assumed to be more advantageous for it to be situated indoors or at least under cover. A stock of complete connection modules should be kept in reserve at the service bay, at least one of each type of connection module included in the switchgear station. Alternatively, or in addition, a stock of spare parts may also be kept in the service bay. Also provided at the service bay are an overhead crane and other types of lifting gear and the tools and material necessary for repair and maintenance of the connection modules.

The spare connection module 3b is arranged in a stand-by position in the service bay 6, erected on and anchored to a loose foot-plate 7 on the floor/ground of the service bay. It is so arranged that the service vehicle can reverse up to it and straddle the stand of the module for loading onto the trailer, as described below when describing the service vehicle.

Assembly of connection modules 3 can also be performed at the service bay 6 which is therefore equipped with base plate and contacts for disconnectors corresponding to those at each connection module site in the switchgear station. When the connection modules have been assembled they are adjusted to the contact units. The resistance of the current path is checked and the factory-fitted control cables connected with plug-in contacts to a testing device so that the apparatus included can be tested as to function. Most of the measures required for installing a connection module at its site 2a in the switchgear station can thus be performed already in the service bay, thereby reducing the work out in the switchgear station to a minimum.

After assembly, exchange, repair or service, the connection module is transported out to its erection site 2a.

When the service vehicle 4 reaches the erection site or base plate 2 where the reserve connection module 3b is to be placed, it will fit without any adjustment since the base plate 2a and the contacts here correspond to those against which the connection module 3b has already been tested at the service bay 6. The control cables from the station may already be in place and terminate in plug-in connectors so all that has to be done is plug them directly into the control cable connection of the connection module 3b.

Figure 5:
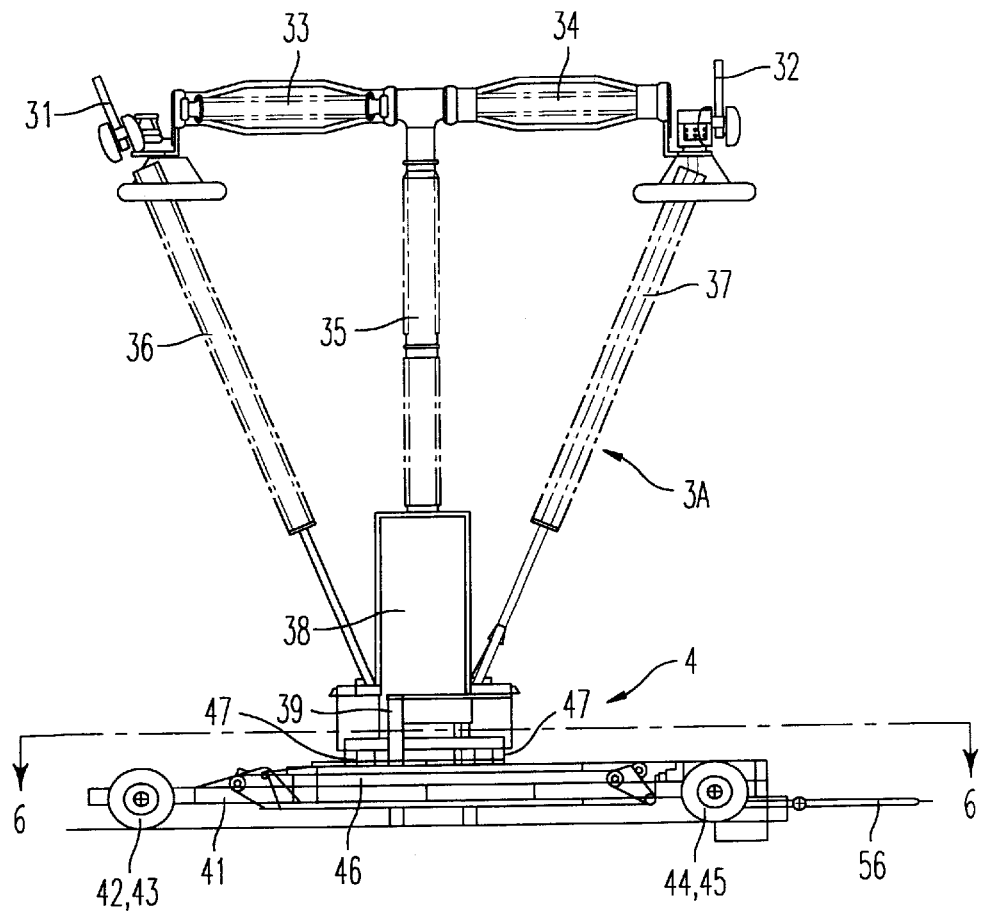
FIG. 5 shows a side view of a service vehicle with load according to one embodiment of the invention.

FIG. 5 illustrates the transport vehicle in the form of a trailer 4 loaded with a connection module 3a. The connection module 3a is a combined module comprising disconnectors 31, 32, breaker elements 33, 34 a central support insulator 35 and inclined operating insulators 36, 37 on each side of the latter, a control device 38 and a stand part 39. Other components, not shown, are also included in such a connection module. The design of the connection module per se does not constitute any central aspect of the present invention and reference is therefore only made to said SE-9600123-5 mentioned previously, for a more detailed description of such and similar combined connection modules. The connection module being transported may naturally be of conventional type containing only one apparatus.

Figure 6:
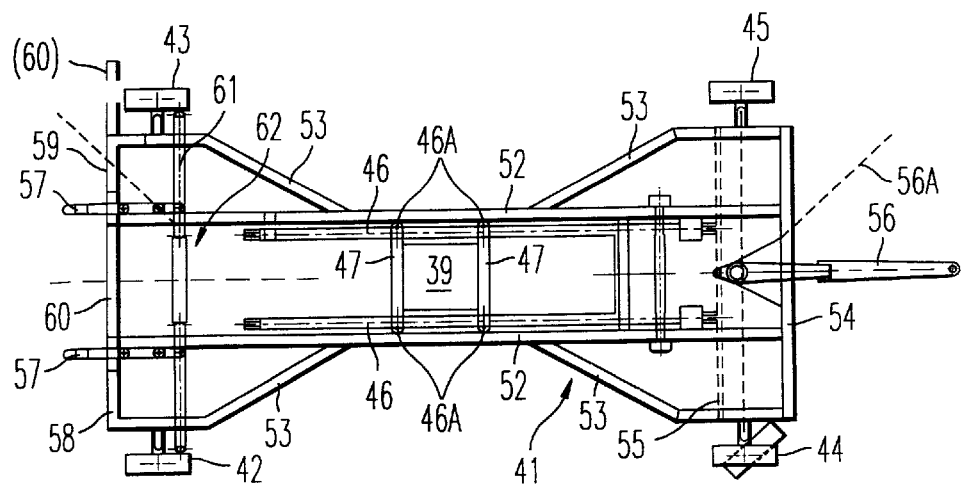
FIG. 6 is a section along the line VI—VI in FIG. 5.

FIG. 6, showing a view along the line VI—VI in FIG. 5, illustrates a bird's-eye view of the service trailer 4. It comprises a frame 41 provided with wheels and comprising two parallel beams 52 placed relatively close together and running in the direction of movement of the trailer. At each end of the pair of beams 52 the frame widens considerably through a construction of inclined and transverse beams 53, 54, 58, 59 to provide a wide base for the pairs of wheels 42, 43, 44, 45 at each end. The two front wheels 44, 45 can be steered and are operated with the aid of a link mechanism connected to the pull rod 56. The tie bar can be angled, as shown by the position 56a indicated in broken lines, so that the front wheels turn.

The rear wheels 42, 43 are normally locked in a straight position by the control sticks 57. Their two steering rods 61 can be connected together by a link 62. When the control sticks 57 are released from their locked position the rear wheels can be steered by means of these control sticks 57. Since all four wheels can be steered, extremely narrow turns can be performed in narrow passages. This is also facilitated by the narrow waist at the middle of the trailer. All four wheels being controllable also facilitates fine adjustment of the trailer's position when fitting it against both the support beams 47 of the apparatus stand (during loading) and against the anchoring aperture of the base plate (during unloading).

The front end of the frame is provided with a cross bar 54 extending across the maximum width of the whole frame, whereas its rear end consists of two short cross bars 58, 59, aligned with each other and leaving an opening between them in the area between the parallel longitudinal beams 52. This opening can be closed by a cross bar 60 which is displaceable in the direction of the cross bars 58, 59. The Figure shows the cross bar 60 in closed position while its open positioned is marked with broken lines. The distance between the two longitudinal beams 52 is slightly greater than the width of the stand of a connection module.

A connection module is loaded onto the trailer 4 by reversing the trailer in towards the stand of the module with the cross bar 60 open and so that the two longitudinal beams 52 straddle the stand. The trailer is reversed until the stand of the connection module 3a is mid-way between the wheel axles of the trailer, the support beams 47 being arranged to be higher up than the support members 46. The cross bar 60 can then be moved to its closed position so that the frame is closed and thus stable. The support member 46 is then raised to contact the support beams 47 of the stand, after which the four attachment points 46a are adjusted individually to the correct height level and the support beams 47 are screwed into the support member 46. When this has been done the stand 3a is detached from its base plate 2a out in the switchgear station or from the foot-plate 7 used for assembly at the service bay 6, after which the support member 46 is raised further to lift the entire connection module from its base plate. The connection module is thus ready for transport.

The support member 46 is arranged to be able to lift the connection module in a plane which is displaced vertically in a strictly horizontal position. This is important since the connection module is extremely heavy and its centre of gravity is located high up, approximately 4 m. The connection module is sufficiently firmly anchored in the support member 46 and the support member in the frame 41, to be able to absorb the considerable bending moments in longitudinal and transverse direction which appear during transport as a result of the elevated centre of gravity of the connection module.

Figure 7:
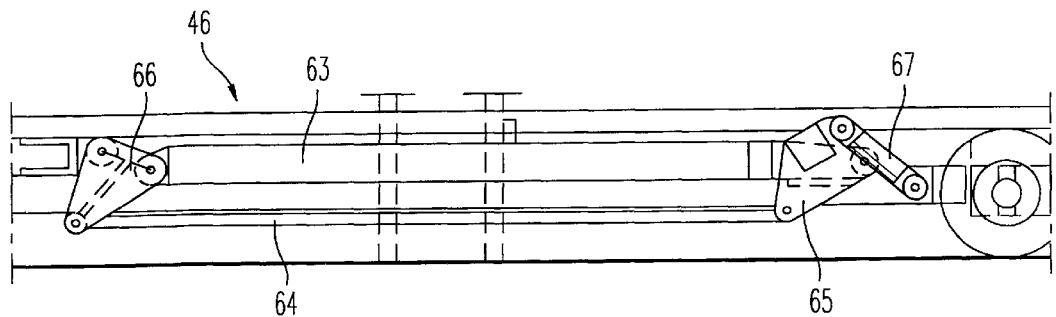
FIG. 7 shows a detail of the service vehicle according to FIG. 5.

FIG. 7 illustrates how the support member 46 is raised and lowered. The support member 46 comprises two parallel mechanisms, each consisting of an upper beam 63 and a lower beam 64 parallel thereto. The upper beam 63 in each mechanism constitutes the support surface for the support beams 47 of the stand. The two beams 63, 64 are joined to a front hinge 65 and a rear articulation means 66. The articulation means 65 and 66 are each articulately connected to beam 63 and beam 64 and suspended in an articulated manner in the frame of the trailer. The front articulated means 65 is connected to a hydraulic cylinder 67 by means of which it can be turned about its articulation connected to the frame. The articulation means then forces the two beams 63, 64 to move closer or further away from each other in a parallel movement, and the rear articulation means to follow this movement. The load-carrying surface of the support member 46 is thus lowered or raised. The two parallel mechanisms are raised and lowered synchronously. The hydraulic cylinder 67 is driven by a motor, or it may be pumped manually. Instead of the hydraulic cylinder 67 a worm gear may be used, which is operated manually or by a motor.

Figure 8:
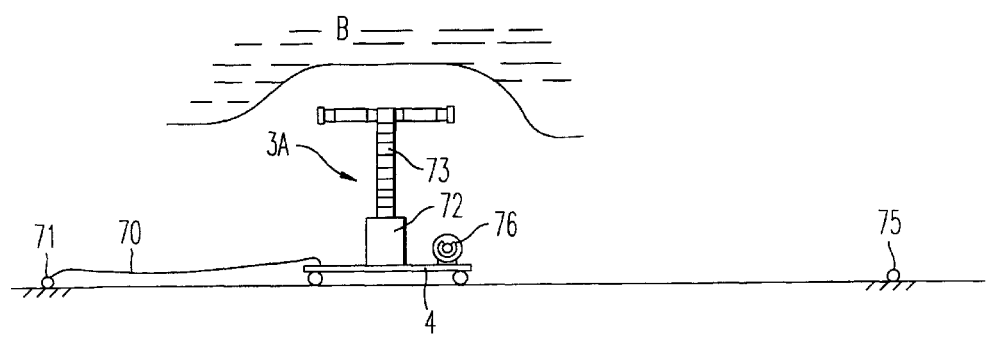
FIG. 8 illustrates the transport of a module according to a preferred embodiment of the invention.

FIG. 8 illustrates schematically a connection module 3a during transport. The trailer 4 is connected to a grounding point 71 within the switchgear area by a flexible cable 70 that can be rolled up. The trailer and the stand part 72 of the module 3a are therefore grounded. The apparatus part of the module is insulated from ground by the support insulator 73 and may be brought close to surrounding live areas from adjacent modules which are in operation. The cable 70 is approximately 25 m long and when the full length of the cable has been utilized a second cable 76, shown rolled up, can be connected to the next grounding point 75 in the direction of travel. The first cable 70 is then disconnected from the grounding point 71 and the cable 70 rolled up on the trailer. At least one grounding point must always be connected. A number of such grounding points are thus arranged within the switchgear area, the distance between them being adjusted to the length of the cables 70, 76 so that the cables 70, 76 can be connected alternately to the grounding points.

Although the connection modules described above are transported in upright position, which is preferable for a number of reasons, transport of the modules in lying position or oriented in some other way is also feasible and within the scope of the invention.

What is claimed is:

1. A system for assembly and maintenance of connection modules in a high-voltage switchgear, said switchgear including a plurality of the connection modules and a plurality of base plates, each connection module being secured to the ground by one of the base plates, the connection modules being positioned in a layout forming a plurality of connection modules in an X-direction and a plurality of connection modules in a Y-direction, said system comprising:

a service vehicle and a service bay;

wherein the service is configured to load, unload, and transport a connection module and includes means for transporting the connection module in an upright position;

wherein said service bay is situated in a vicinity of the switchgear and includes at least one complete reserve connection module in an upright position;

and wherein said switchgear includes predetermined corridors between the plurality of connection modules along which said service vehicle can move, and said service vehicle, the connection modules, the location of said base plates are configured such that said service vehicle can move within the switchgear area through the predetermined corridors.

2. A system as claimed in claim 1, wherein said service bay is situated under a cover.

3. A system as claimed in claim 1, further comprising at least one grounding point arranged within an area around the switchgear, and wherein said service vehicle is provided with conducting members connectable to said at least one grounding point.

4. A system as claimed in claim 1, further comprising a grounding cable connecting a grounding point to the connection module being transported by said service vehicle.

* * * * *